US012564879B2

(12) United States Patent (10) Patent No.: US 12,564,879 B2

Negishi et al. (45) Date of Patent: Mar. 3, 2026

(54) COPPER PASTE FOR JOINING, METHOD FOR MANUFACTURING JOINED BODY, AND JOINED BODY

(71) Applicant: Showa Denko Materials Co., Ltd., Tokyo (JP)

(72) Inventors: Motohiro Negishi, Tokyo (JP); Hideo Nakako, Tokyo (JP); Michiko Natori, Tokyo (JP); Dai Ishikawa, Tokyo (JP); Chie Sugama, Tokyo (JP); Yuki Kawana, Tokyo (JP)

(73) Assignee: RESONAC CORPORATION, Tokyo (JP)

( * ) Notice: Subject to any disclaimer, the term of this patent is extended or adjusted under 35 U.S.C. 154(b) by 753 days.

(21) Appl. No.: 17/764,273

(22) PCT Filed: Sep. 30, 2019

(86) PCT No.: PCT/JP2019/038626

§ 371 (c)(1),
(2) Date: Mar. 28, 2022

(87) PCT Pub. No.: WO2021/064826

PCT Pub. Date: Apr. 8, 2021

(65) Prior Publication Data

US 2022/0371087 A1 Nov. 24, 2022

(51) Int. Cl.
B22F 1/052 (2022.01)
B22F 1/00 (2022.01)
(Continued)

(52) U.S. Cl.
CPC ............... B22F 1/052 (2022.01); B22F 1/00 (2013.01); B22F 1/0545 (2022.01); B22F 1/056 (2022.01);
(Continued)

(58) Field of Classification Search
CPC .......... B22F 1/00; B22F 1/0545; B22F 1/056; B22F 1/147; B22F 1/062; B22F 1/068;
(Continued)

(56) References Cited

U.S. PATENT DOCUMENTS 6,989,110 B2 * 1/2006 Yonezawa ................ C08K 3/08
252/512
2019/0355690 A1 * 11/2019 Nakako .................... B22F 7/064
2020/0108471 A1 * 4/2020 Ishikawa .............. B23K 35/302

FOREIGN PATENT DOCUMENTS

CN 107921540 A 4/2018
CN 107949447 A 4/2018
(Continued)

OTHER PUBLICATIONS

Matsumoto Hiroto et. al. [WO2016132814A1] (machine translation) (Year: 2016).*
(Continued)

*Primary Examiner* — Sally A Merkling
*Assistant Examiner* — Nazmun Nahar Shams
(74) *Attorney, Agent, or Firm* — FITCH, EVEN, TABIN & FLANNERY, LLP

(57) ABSTRACT

A copper paste for joining contains metal particles and a dispersion medium, in which the copper paste for joining contains copper particles as the metal particles, and the copper paste for joining contains dihydroterpineol as the dispersion medium. A method for manufacturing a joined body is a method for manufacturing a joined body which includes a first member, a second member, and a joining portion that joins the first member and the second member, the method including: a first step of printing the above-described copper paste for joining to at least one joining surface of the first member and the second member to prepare a laminate having a laminate structure in which the first member, the copper paste for joining, and the second (Continued)

member are laminated in this order; and a second step of sintering the copper paste for joining of the laminate.

19 Claims, 9 Drawing Sheets

(51) Int. Cl.
| | |
|---|---|
| *B22F 1/054* | (2022.01) |
| *B22F 1/0545* | (2022.01) |
| *B22F 1/062* | (2022.01) |
| *B22F 1/068* | (2022.01) |
| *B22F 1/107* | (2022.01) |
| *B22F 1/145* | (2022.01) |
| *B22F 7/00* | (2006.01) |
| *B22F 7/08* | (2006.01) |
| *H01L 23/00* | (2006.01) |

(52) U.S. Cl.
CPC .............. *B22F 1/09* (2022.01); *B22F 1/107* (2022.01); *B22F 1/147* (2022.01); *B22F 7/008* (2013.01); *B22F 7/08* (2013.01); *H01L 24/27* (2013.01); *H01L 24/29* (2013.01); *H01L 24/32* (2013.01); *H01L 24/83* (2013.01); *B22F 1/062* (2022.01); *B22F 1/068* (2022.01); *B22F 2301/10* (2013.01); *B22F 2302/45* (2013.01); *B22F 2303/40* (2013.01); *B22F 2304/056* (2013.01); *B22F 2304/058* (2013.01); *B22F 2304/10* (2013.01); *H01L 24/40* (2013.01); *H01L 24/48* (2013.01); *H01L 24/73* (2013.01); *H01L 2224/2732* (2013.01); *H01L 2224/29147* (2013.01); *H01L 2224/32245* (2013.01); *H01L 2224/40245* (2013.01); *H01L 2224/48245* (2013.01); *H01L 2224/73263* (2013.01); *H01L 2224/73265* (2013.01); *H01L 2224/8384* (2013.01); *H01L 2924/35121* (2013.01); *H01L 2924/37001* (2013.01)

(58) Field of Classification Search
CPC .............. B22F 2301/10; B22F 2302/45; B22F 2303/40; B22F 2304/056; B22F 2304/058; B22F 2304/10; B22F 7/062; B22F 2007/047; B22F 1/10; B22F 9/00; C22C 1/0425; B23K 35/025; B23K 35/302; B29C 66/7481; B29C 2037/0035; B29C 73/02; B29C 66/0382

See application file for complete search history.

(56) References Cited

FOREIGN PATENT DOCUMENTS

| | | | |
|---|---|---|---|
| CN | 109070206 | A | 12/2018 |
| CN | 110167695 | A | 8/2019 |
| EP | 3450053 | A1 | 3/2019 |
| JP | 5006081 | B2 | 8/2012 |
| JP | 2014-167145 | A | 9/2014 |
| JP | 2017-103180 | A | 6/2017 |
| JP | 2018-152176 | A | 9/2018 |
| JP | 2018-156736 | A | 10/2018 |
| JP | 6563618 | B1 | 8/2019 |
| JP | 2020-113660 | A | 7/2020 |
| WO | 2016/132814 | A1 | 8/2016 |

OTHER PUBLICATIONS

Nakako Takeo et. al. [JP2018152176A] (machine translation) (Year: 2018).*

Furusawa Hideki et. al. [WO2019069635A1] (machine translation) (Year: 2019).*

Furusawa Hideki et. al. [JP6563618B1] (machine translation) [hereafter Hideki'JP618]. (Year: 2019).*

WO2022059733A1 (machine translation) (Year: 2022).*

* cited by examiner (a)

(b)

(a)

(b)

(c)

(a)

(b)

(a)

(b)

COPPER PASTE FOR JOINING, METHOD FOR MANUFACTURING JOINED BODY, AND JOINED BODY

CROSS-REFERENCE TO RELATED APPLICATIONS

This application is a U.S. national phase application filed under 35 U.S.C. § 371 of International Application No. PCT/JP2019/038626, filed Sep. 30, 2019, which is incorporated herein by reference in its entirety.

TECHNICAL FIELD

The present invention relates to a copper paste for joining, a method for manufacturing a joined body, and a joined body.

BACKGROUND ART

In the manufacturing of semiconductor devices, a variety of joining materials are used in order to join a semiconductor element and a lead frame or the like (support member). High-melting-point lead solders have been used as a joining material for the joining of, among semiconductor devices, power semiconductors, LSI, and the like that are operated at a high temperature of 150° C. or higher. In recent years, an increase in the capacity of semiconductor elements and the energy-saving trend have increased the operation temperature to near the melting point of high-melting-point lead solders, which has made it difficult to ensure connection reliability. On the other hand, in association with the tightening of RoHS regulations, there has been a demand for joining materials containing no lead.

Hitherto, the joining of semiconductor elements using a material other than lead solders has been studied. For example, in Patent Literature 1 below, a joining material containing cupric II oxide particles having an average particle diameter of 1 nm to 50 μm and a reducing agent has been disclosed as a joining material for joining a semiconductor element and an electrode. Furthermore, in Patent Literature 2 below, a joining material containing copper nanoparticles, and copper micro particles or copper submicro particles, or both of copper micro particles or copper submicro particles has been disclosed.

CITATION LIST

Patent Literature

Patent Literature 1: Japanese Patent No. 5006081
Patent Literature 2: Japanese Unexamined Patent Publication No. 2014-167145

SUMMARY OF INVENTION

Technical Problem

However, in consideration of a mass production process in the manufacturing semiconductor devices, it is required for the joining material to have printing properties suitable for printing processes by automated printers such as a screen printer. In general, a paste obtained by dispersing metal particles in a dispersion medium is blended with a dispersion medium such as an organic solvent to decrease a viscosity thereof so that printing properties can be improved. However, in the case of a paste containing copper particles, when the particle concentration is too low, a sufficient joining strength may be difficult to be obtainable, and this may affect joining properties. It is not necessarily easy to achieve both of printing properties that make printing possible without blurring or missing under printing conditions in automated printing and joining properties.

The present invention has been made in view of the above-described circumstances, and an object thereof is to provide a copper paste for joining with which printing properties can be improved while sufficient joining properties are maintained and to provide a method for manufacturing a joined body and a joined body that use the copper paste for joining.

Solution to Problem

An aspect of the present invention relates to a copper paste for joining containing metal particles and a dispersion medium, in which the copper paste for joining contains copper particles as the metal particles, and the copper paste for joining contains dihydroterpineol as the dispersion medium.

When the copper paste for joining has the above-described configuration, printing properties can be improved while sufficient joining properties are maintained. According to the copper paste for joining, it is possible to efficiently produce a joined body by a mass production process using an automated printer such as a screen printer.

The reason why such effects are obtainable is not clear, but it is considered that, since dihydroterpineol is excellent in affinity with copper particles, the dispersibility of the copper particles is improved, the viscosity can be decreased at a sufficient copper particle concentration, and both of printing properties and joining properties can be achieved. Furthermore, the present inventors have speculated, as one of factors of obtaining the above-described effects, that since dihydroterpineol can increase thixotropy of a paste, both of fluidity during printing and the shape retaining force of the paste after printing are achieved in a high level.

In the copper paste for joining, a content of the metal particles may be 85 to 98% by mass on the basis of the total amount of the copper paste for joining. In this case, it becomes easy to ensure a joining strength and to cope with an increase in size of a member to be joined (for example, the size of a semiconductor element).

In the copper paste for joining, the dispersion medium can further contain a compound having a boiling point of 300° C. or higher as the dispersion medium. In this case, plasticity and adhesiveness are imparted to the copper paste for joining immediately before the start of sintering, and joining under non-pressurization becomes easy.

In the copper paste for joining, a viscosity at 25° C. may be 100 to 200 Pa·s. In this case, compatibility with an automated printer is further improved.

A content of the copper particles may be 80 to 100% by mass on the basis of the total mass of the metal particles.

The copper paste for joining may be for screen printing. Note that, the screen printing in the present specification is also called stencil printing and means a printing method of rubbing a paste against a plate having a hole (opening). Squeegees, scrapers, and the like are not particularly limited, and known tools can be appropriately applied.

The copper paste for joining may contain submicro copper particles having a volume average particle diameter of 0.12 to 0.8 μm and flake-shaped micro copper particles having a maximum diameter of 2 to 50 μm and an aspect ratio of 3.0 or more as the copper particles. This case is suitable for joining under non-pressurization.

Note that, the term "non-pressurization" in the present specification means a state in which the copper paste for joining receives only the weight of a member to be joined (that is, does not receive a pressure other than the weight of the member) or receives a micropressure of 0.01 MPa or less in addition to the weight thereof.

A content of the submicro copper particles in the copper paste for joining may be 30 to 90% by mass on the basis of the total mass of the copper particles, and a content of the micro copper particles may be 10 to 70% by mass on the basis of the total mass of the copper particles.

The copper paste for joining may be for non-pressurization joining.

Another aspect of the present invention relates to a method for manufacturing a joined body which includes a first member, a second member, and a joining portion that joins the first member and the second member, the method including: a first step of printing the above-described copper paste for joining to at least one joining surface of the first member and the second member to prepare a laminate having a laminate structure in which the first member, the copper paste for joining, and the second member are laminated in this order; and a second step of sintering the copper paste for joining of the laminate. According to this manufacturing method, it is possible to achieve both of printing properties and joining properties and to efficiently manufacture a joined body by using the above-described copper paste for joining.

The printing may be for screen printing.

In the second step, the copper paste for joining may be sintered by being heated under non-pressurization. In this case, it is possible to reduce damages to a member to be joined by non-pressurization joining.

At least one of the first member and the second member may be a semiconductor element. In this case, a semiconductor device can be obtained as the joined body.

Still another aspect of the present invention relates to a joined body including: a first member; a second member; and a joining portion that joins the first member and the second member, in which the joining portion is made of a sintered body of the above-described copper paste for joining.

At least one of the first member and the second member may be a semiconductor element. That is, the joined body may be a semiconductor device.

Advantageous Effects of Invention

According to the present invention, it is possible to provide a copper paste for joining with which printing properties can be improved while sufficient joining properties are maintained and to provide a method for manufacturing a joined body and a joined body that use the copper paste for joining.

DESCRIPTION OF EMBODIMENTS

Figure 1:
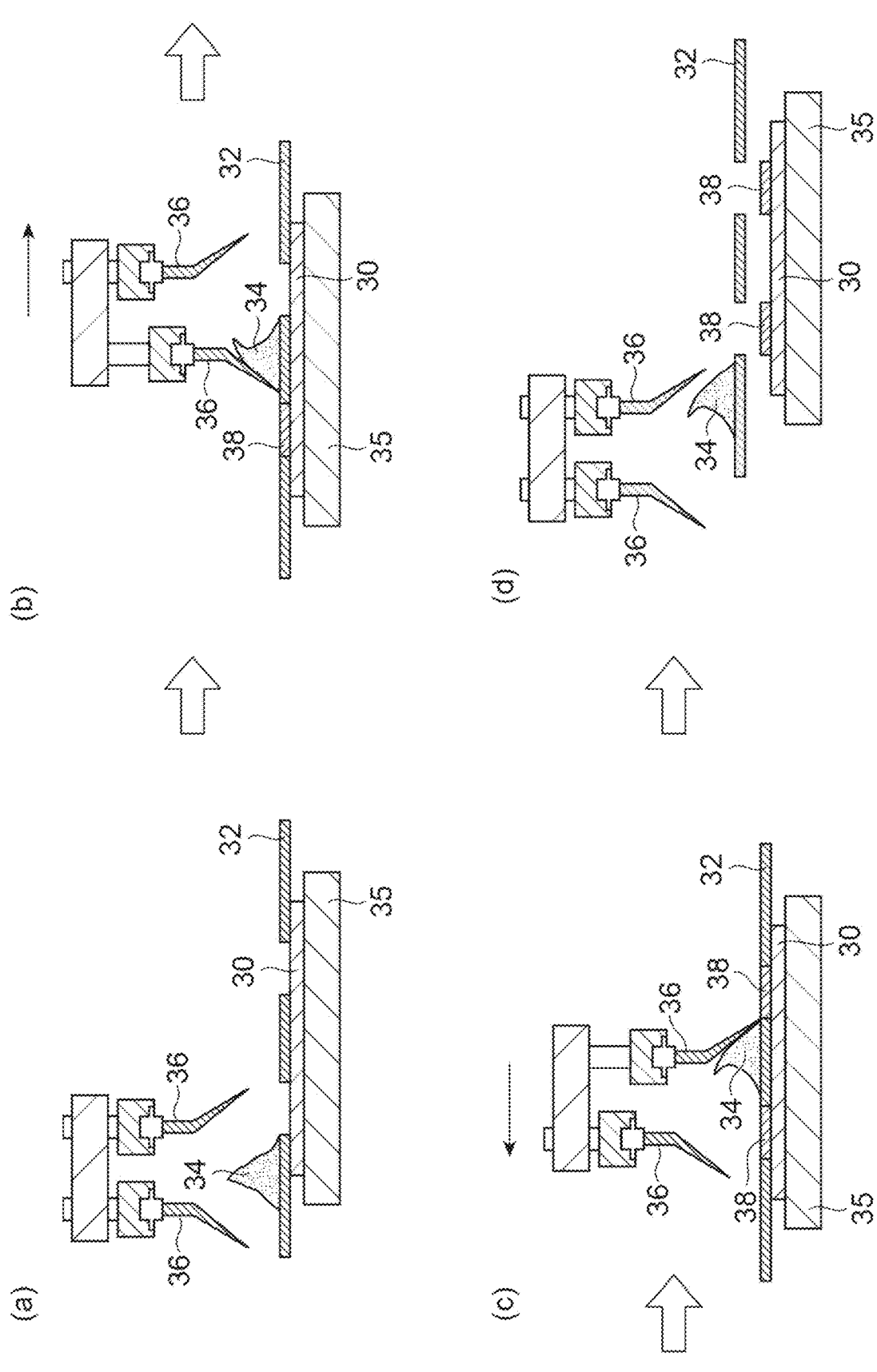
FIG. 1 is a schematic view for describing screen printing.

First, the details of a copper paste for joining of the present embodiment will be described.

<Copper Paste for Joining>

A copper paste for joining of the present embodiment contains metal particles and a dispersion medium, in which the copper paste for joining contains copper particles as the metal particles, and the copper paste for joining contains dihydroterpineol as the dispersion medium. Note that, in the present specification, for convenience sake, the aggregation of a plurality of copper particles is also referred to as "copper particles". The same applies to metal particles other than the copper particles.

(Copper Particles)

Examples of the copper particles include submicro copper particles, micro copper particles, and copper particles other than these.

[Submicro Copper Particles]

The submicro copper particles are copper particles having a particle diameter of 0.01 μm or more and less than 1.00 μm. The submicro copper particles preferably have sinterability in a temperature range of 150° C. or higher and 300° C. or lower. The submicro copper particles preferably include copper particles having a particle diameter of 0.01 to 0.80 μm. The submicro copper particles may include copper particles having a particle diameter of 0.01 to 0.80 μm in 10% by mass or more, 20% by mass or more, 30% by mass or more, or 100% by mass. The particle diameter of the copper particles can be calculated, for example, from an SEM image. A powder of the copper particles is placed on carbon tape for SEM using a spatula, thereby producing a sample for SEM. This sample for SEM is observed using an SEM apparatus at a magnification of 5000 times. A rectangle circumscribing the copper particle in this SEM image is drawn using image processing software, and the one side of the rectangle is considered as the particle diameter of the particle.

The volume average particle diameter of the submicro copper particles is preferably 0.01 to 0.80 μm. When the volume average particle diameter of the submicro copper particles is 0.01 μm or more, it becomes easy to obtain effects of the suppression of the synthesis cost of the submicro copper particles, favorable dispersibility, and the suppression of the amount of a surface treatment agent used. When the volume average particle diameter of the submicro copper particles is 0.80 μm or less, it becomes easy to obtain an effect of the submicro copper particles being excellent in terms of the sinterability. From the viewpoint of even further exhibiting the above-described effect, the volume average particle diameter of the submicro copper particles may be 0.02 μm or more, 0.05 μm or more, 0.10 μm or more, 0.11 μm or more, 0.12 μm or more, 0.15 μm or more, 0.2 μm or more, or 0.3 μm or more. Furthermore, from the viewpoint of even further exhibiting the above-described effect, the volume average particle diameter of the submicro copper particles may be 0.60 μm or less, 0.50 μm or less, 0.45 μm or less, or 0.40 μm or less. The volume average particle diameter of the submicro copper particles may be, for example, 0.01 to 0.60 μm, 0.01 to 0.50 μm, 0.02 to 0.80 μm, 0.05 to 0.80 μm, 0.10 to 0.80 μm, 0.11 to 0.80 μm, 0.12 to 0.80 μm, 0.15 to 0.80 μm, 0.15 to 0.60 μm, 0.20 to 0.50 μm, 0.30 to 0.45 μm, or 0.30 to 0.40 μm.

The volume average particle diameter in the present specification means a 50% volume average particle diameter. The volume average particle diameter of the metal particles (for example, copper particles) can be measured, for example, by the following method. First, metal particles serving as a raw material or dried metal particles obtained by removing a volatile component from the metal paste are dispersed in a dispersion medium by using a dispersant. Next, the volume average particle diameter of the obtained dispersion element is measured by a light scattering-method particle size distribution analyzer (for example, Shimadzu nano particle size distribution analyzer (SALD-7500nano, manufactured by SHIMADZU CORPORATION)). In the case of using a light scattering-method particle size distribution analyzer, as the dispersion medium, hexane, toluene, α-terpineol, 4-methyl-1,3-dioxolan-2-one, and the like can be used.

The shape of the submicro copper particles is not particularly limited. Examples of the shape of the submicro copper particles include a spherical shape, a block shape, a needle shape, a columnar shape, a flake shape, a substantially spherical shape, and an aggregate thereof. From the viewpoint of dispersibility and fillability, the shape of the submicro copper particles may be a spherical shape, a substantially spherical shape, or a flake shape, and from the viewpoint of combustibleness, dispersibility, a property of mixing with a flake-shaped micro particles (for example, flake-shaped micro copper particles), and the like, the shape of the submicro copper particles may be a spherical shape or a substantially spherical shape. In the present specification, the "flake shape" includes flat plate-like shapes such as a plate shape and a scale shape.

The aspect ratio of the submicro copper particles may be 5.0 or less, may be 3.0 or less, may be 2.5 or less, or may be 2.0 or less, from the viewpoint of dispersibility, fillability, and mixability with flake-shaped micro particles (for example, flake-shaped micro copper particles). In the present specification, the term "aspect ratio" represents a ratio of "a long side of particles/a thickness of particles". The long side of particles and the thickness of particles can be obtained, for example, from an SEM image of particles.

From the viewpoint of the dispersibility of the submicro copper particles, the submicro copper particles may be treated with a surface treatment agent. The surface treatment agent may be, for example, adsorbed on the surface of the submicro copper particles by a hydrogen bond or the like, or may react with the submicro copper particles to bond to the surface of the submicro copper particles. That is, the submicro copper particles may have a compound derived from a specific surface treatment agent. The surface treatment agent is included in an organic compound contained in the copper paste for joining.

Examples of the surface treatment agent include organic acids having 2 to 18 carbon atoms. Examples of the organic acids having 2 to 18 carbon atoms include saturated fatty acids such as acetic acid, propanoic acid, butanoic acid, pentanoic acid, hexanoic acid, heptanoic acid, caprylic acid, methylheptanoic acid, ethylhexanoic acid, propylpentanoic acid, pelargonic acid, methyloctanoic acid, ethylheptanoic acid, propylhexanoic acid, capric acid, methylnonanoic acid, ethyloctanoic acid, propylheptanoic acid, butylhexanoic acid, undecanoic acid, methyldecanoic acid, ethylnonanoic acid, propyloctanoic acid, butylheptanoic acid, lauric acid, methylundecanoic acid, ethyldecanoic acid, propylnonanoic acid, butyloctanoic acid, pentylheptanoic acid, tridecanoic acid, methyldodecanoic acid, ethylundecanoic acid, propyldecanoic acid, butylnonanoic acid, pentyloctanoic acid, myristic acid, methyltridecanoic acid, ethyldodecanoic acid, propylundecanoic acid, butyldecanoic acid, pentylnonanoic acid, hexyloctanoic acid, pentadecanoic acid, methyltetradecanoic acid, ethyltridecanoic acid, propyldodecanoic acid, butylundecanoic acid, pentyldecanoic acid, hexylnonanoic acid, palmitic acid, methylpentadecanoic acid, ethyltetradecanoic acid, propyltridecanoic acid, butyldodecanoic acid, pentylundecanoic acid, hexyldecanoic acid, heptylnonanoic acid, heptadecanoic acid, octadecanoic acid, methylcyclohexanecarboxylic acid, ethylcyclohexanecarboxylic acid, propylcyclohexanecarboxylic acid, butylcyclohexanecarboxylic acid, pentylcyclohexanecarboxylic acid, hexylcyclohexanecarboxylic acid, heptylcyclohexanecarboxylic acid, octylcyclohexanecarboxylic acid, and nonylcyclohexanecarboxylic acid; unsaturated fatty acids such as octenoic acid, nonenoic acid, methylnonenoic acid, decenoic acid, undecenoic acid, dodecenoic acid, tridecenoic acid, tetradecenoic acid, myristoleic acid, pentadecenoic acid, hexadecenoic acid, palmitoleic acid, sapienic acid, oleic acid, vaccenic acid, linolic acid, linoleic acid, and linolenic acid; and aromatic carboxylic acids such as terephthalic acid, pyromellitic acid, o-phenoxybenzoic acid, methylbenzoic acid, ethylbenzoic acid, propylbenzoic acid, butylbenzoic acid, pentylbenzoic acid, hexylbenzoic acid, heptylbenzoic acid, octylbenzoic acid, and nonylbenzoic acid. The organic acids may be used alone or in combination of two or more kinds thereof. By combining such an organic acid and the above-described submicro copper particles, there is a tendency that both the dispersibility of the submicro copper particles and removal properties of the organic acid during sintering can be achieved.

The treatment amount of the surface treatment agent may be 0.07 to 2.10% by mass, 0.10 to 1.60% by mass, or 0.20 to 1.10% by mass, on the basis of the total mass of the submicro copper particles after the surface treatment, from the viewpoint of the dispersibility of the submicro copper particles. The treatment amount of the surface treatment agent may be 0.07% by mass or more, 0.10% by mass or more, or 0.20% by mass or more, on the basis of the total mass of the submicro copper particles after the surface treatment. The treatment amount of the surface treatment agent may be 2.10% by mass or less, 1.60% by mass or less, or 1.10% by mass or less, on the basis of the total mass of the submicro copper particles after the surface treatment.

The treatment amount of the surface treatment agent may be an amount in which one molecule layer to three molecule layers of the surface treatment agent are attached to the surfaces of the submicro copper particles. This treatment amount is measured by the following method. W1 (g) of the surface-treated submicro copper particles is weighed into an alumina crucible (for example, manufactured by AS ONE Corporation, Model No.: 1-7745-07) treated at 700° C. for 2 hours in air and then sintered at 700° C. for 1 hour in air. Thereafter, the treatment is performed at 300° C. for 1 hour in hydrogen and a mass W2 (g) of the copper particles in the crucible is measured. Next, the treatment amount of the surface treatment agent is calculated on the basis of the following equation.

$$\text{Treatment amount (\% by mass) of surface treatment agent} = (W1 - W2)/W1 \times 100$$

As the submicro copper particles, commercially available submicro copper particles can be used. Examples of materials containing commercially available submicro copper particles include CH-0200 (manufactured by MITSUI MINING & SMELTING CO., LTD., volume average particle diameter 0.36 μm), HT-14 (manufactured by MITSUI MINING & SMELTING CO., LTD., volume average particle diameter 0.41 μm), CT-500 (manufactured by MITSUI MINING & SMELTING CO., LTD., volume average particle diameter 0.72 μm), Tn-Cu100 (manufactured by TAIYO NIPPON SANSO CORPORATION, volume average particle diameter 0.12 μm), and Cu—C-40 (manufactured by Fukuda Metal Foil & Powder Co., Ltd., volume average particle diameter 0.2 μm).

The content of the submicro copper particles may be 30% by mass or more, 35% by mass or more, 40% by mass or more, or 50% by mass or more, or may be 90% by mass or less or 85% by mass or less, on the basis of the total mass of the copper particles contained in the copper paste for joining. Furthermore, the content of the submicro copper particles may be 30 to 90% by mass, 35 to 90% by mass, 40 to 85% by mass, or 50 to 85% by mass, on the basis of the total mass of the copper particles contained in the copper paste for joining. When the content of the submicro copper particles is within the above range, it becomes easy to ensure the joining strength of a joined body that is manufactured by sintering the copper paste for joining. In the case of using the copper paste for joining in the joining of a microdevice, there is a tendency that the microdevice shows favorable die shear strength and connection reliability.

[Micro Copper Particles]

The micro copper particles are copper particles having a particle diameter of 1 μm or more and less than 50 μm. The micro copper particles preferably include copper particles having a particle diameter of 2.0 to 50 μm. The micro copper particles may include copper particles having a particle diameter of 2.0 to 50 μm in 50% by mass or more, 70% by mass or more, 80% by mass or more, or 100% by mass.

The volume average particle diameter of the micro copper particles is preferably 2.0 to 50 μm. When the volume average particle diameter of the micro copper particles is within the above range, it is possible to reduce volume shrinkage, occurrence of voids, and the like when the copper paste for joining has been sintered, and it becomes easy to ensure the joining strength of a joined body that is manufactured by sintering the copper paste for joining. In the case of using the copper paste for joining in the joining of a microdevice, there is a tendency that the microdevice shows favorable die shear strength and connection reliability. From the viewpoint of even further exhibiting the above-described effect, the volume average particle diameter of the micro copper particles may be 2.0 to 20 μm, 2.0 to 10 μm, 3.0 to 20 μm, or 3.0 to 10 μm. The volume average particle diameter of the micro copper particles may be 2.0 μm or more or 3.0 μm or more. The volume average particle diameter of the micro copper particles may be 50 μm or less, 20 μm or less, or 10 μm or less.

The shape of the micro copper particles is not particularly limited. Examples of the shape of the micro copper particles include a spherical shape, a block shape, a needle shape, a flake shape, a substantially spherical shape, and an aggregate thereof. Among these, a preferable shape of the micro copper particles is a flake shape. The micro copper particles may include flake-shaped micro copper particles in 50% by mass or more, 70% by mass or more, 80% by mass or more, or 100% by mass.

By using the flake-shaped micro copper particles, the micro copper particles in the copper paste for joining are oriented in approximately parallel to a joining surface, and thus the volume shrinkage in a joining surface direction when the copper paste for joining is sintered can be suppressed and it becomes easy to ensure the joining strength of a joined body that is manufactured by sintering the copper paste for joining. In the case of using the copper paste for joining in the joining of a microdevice, there is a tendency that the microdevice shows favorable die shear strength and connection reliability. From the viewpoint of even further exhibiting the above-described effect, the aspect ratio of the flake-shaped micro copper particles is preferably 3.0 or more, more preferably 4.0 or more, and further preferably 6.0 or more.

The maximum diameter and the average maximum diameter of the flake-shaped micro copper particles may be 2.0 to 50 μm, 3.0 to 50 μm, or 3.0 to 20 μm. The maximum diameter and the average maximum diameter of the flake-shaped micro copper particles can be obtained, for example, from SEM images of the particles. The maximum diameter and the average maximum diameter of the flake-shaped micro copper particles are obtained, for example, as a major axis X and an average value Xav of the major axis of the flake-shaped micro copper particles. The major axis X is a distance of two parallel planes that are selected so that the distance between two parallel planes is the largest among two parallel planes circumscribing the flake-shaped micro copper particles in the three-dimensional shape of the flake-shaped micro copper particles.

In the micro copper particles, there is no particular limitation as to whether or not to perform a treatment with the surface treatment agent. From the viewpoints of dispersion stability and oxidation resistance, the micro copper particles may be treated with a surface treatment agent. That is, the micro copper particles may have a compound derived from a surface treatment agent. The surface treatment agent may be adsorbed on the surface of the micro copper particles by a hydrogen bond or the like, or may react with the micro copper particles to bond to the surface of the micro copper particles.

The surface treatment agent may be removed by heating during joining Examples of such a surface treatment agent include aliphatic carboxylic acids such as dodecanoic acid, palmitic acid, heptadecanoic acid, stearic acid, arachidic acid, linolic acid, linoleic acid, and oleic acid; aromatic carboxylic acids such as terephthalic acid, pyromellitic acid, and o-phenoxybenzoic acid; aliphatic alcohols such as cetyl alcohol, stearyl alcohol, isobornyl cyclohexanol, and tetraethylene glycol; aromatic alcohols such as p-phenyl phenol; alkylamines such as octylamine, dodecylamine, and stearylamine; aliphatic nitriles such as stearonitrile and decanenitrile; silane coupling agents such as alkylalkoxysilane; and polymer treatment agents such as polyethylene glycol, polyvinyl alcohol, polyvinyl pyrrolidone, and silicone oligomer. The surface treatment agent may be used alone or in combination of two or more kinds thereof.

As the micro copper particles, commercially available submicro copper particles can be used. Examples of materials containing commercially available micro copper particles include 1050YF (manufactured by MITSUI MINING & SMELTING CO., LTD., volume average particle diameter 1.7 μm), MA-C025KFD (manufactured by MITSUI MINING & SMELTING CO., LTD., volume average particle diameter 7.5 μm), 3L3 (manufactured by Fukuda Metal Foil & Powder Co., Ltd., volume average particle diameter 8.0 μm), 2L3N (manufactured by Fukuda Metal Foil & Powder Co., Ltd., volume average particle diameter 9.9 μm), 3L3N (manufactured by Fukuda Metal Foil & Powder Co., Ltd., volume average particle diameter 7 μm), and 1110F (manufactured by MITSUI MINING & SMELTING CO., LTD., volume average particle diameter 3.8 μm).

The content of the micro copper particles may be 10% by mass or more, 15% by mass or more, or 20% by mass or more, and may be 70% by mass or less, 50% by mass or less, 45% by mass or less, or 40% by mass or less, on the basis of the total mass of the copper particles contained in the copper paste for joining. Furthermore, the content of the micro copper particles may be 10 to 70% by mass, 10 to 65% by mass, 10 to 50% by mass, 15 to 60% by mass, 15 to 50% by mass, or 15 to 45% by mass, on the basis of the total mass of the copper particles contained in the copper paste for joining. When the content of the micro copper particles is within the above range, peeling of a joining portion (for example, a sintered body) and occurrence of voids and cracks are suppressed so that the joining strength can be ensured. In the case of using the copper paste for joining in the joining of a microdevice, there is a tendency that the microdevice shows favorable die shear strength and connection reliability. The content of the flake-shaped micro copper particles may be the same as the range of the content of the micro copper particles described above. In a case where the content of the flake-shaped micro copper particles is in such a range, there is a tendency that the above-described effect is even further exhibited.

[Other Copper Particles]

Examples of copper particles other than the submicro copper particles and the micro copper particles include copper nanoparticles. The copper nanoparticles indicate copper particles having a particle diameter of less than 0.01 μm. The surfaces of the copper nanoparticles are generally coated with carboxylic acid or amine (referred to as a surface coating material). The copper nanoparticles have a larger specific surface area than copper micro particles, the ratio of the surface coating material occupied per unit mass tends to increase. Therefore, since the surface coating material to be desorbed during stirring (during heating) is increased, volume shrinkage during stirring tends to increase as compared to the copper micro particles. From the viewpoint of reducing volume shrinkage, the content of the copper nanoparticles is preferably 10% by mass or less and more preferably 5% by mass or less on the basis of the total mass of the copper particles, and it is further preferable that the copper nanoparticles are not contained.

The content of the copper particles contained in the copper paste for joining of the present embodiment may be 80 to 100% by mass, may be 90 to 100% by mass, or may be 95 to 100% by mass, on the basis of the total mass of the metal particles contained in the copper paste for joining.

The copper paste for joining of the present embodiment more preferably contains submicro copper particles and micro copper particles. In the case of using submicro copper particles and micro copper particles together, volume shrinkage and sintering shrinkage along with drying are easily suppressed, and the copper paste for joining is less likely to be peeled off from a joining surface during sintering. That is, by using submicro copper particles and micro copper particles together, volume shrinkage when the copper paste for joining is sintered is suppressed, and the joined body can have a more sufficient joining strength. In the case of using the copper paste for joining, which uses submicro copper particles and micro copper particles together, in joining of a microdevice, the microdevice tends to exhibit more satisfactory die shear strength and connection reliability.

The sum of the content of the submicro copper particles and the content of the micro copper particles may be 80 to 100% by mass on the basis of the total mass of the metal particles contained in the copper paste for joining. When the sum of the content of the submicro copper particles and the content of the micro copper particles within the above range, it is possible to sufficiently reduce volume shrinkage when the copper paste for joining has been sintered, and it becomes easy to ensure the joining strength of a joined body that is manufactured by sintering the copper paste for joining. In the case of using the copper paste for joining in the joining of a microdevice, there is a tendency that the microdevice shows favorable die shear strength and connection reliability. From the viewpoint of further exhibiting the above-described effect, the sum of the content of the submicro copper particles and the content of the micro copper particles may be 90% by mass or more, may be 95% by mass or more, or may be 100% by mass, on the basis of the total mass of the metal particles.

The copper paste for joining of the present embodiment may contain submicro copper particles having a volume average particle diameter of 0.12 to 0.8 μm and flake-shaped micro copper particles having a maximum diameter of 2 to 50 μm and an aspect ratio of 3.0 or more. This case is suitable for joining under non-pressurization. The content of the submicro copper particles in the copper paste for joining in this case may be 30 to 90% by mass on the basis of the total mass of the copper particles, and a content of the micro copper particles may be 10 to 70% by mass on the basis of the total mass of the copper particles.

[Other Metal Particles]

The copper paste for joining of the present embodiment can contain metal particles other than the copper particles (also referred to as "other metal particles").

Examples of the other metal particles include particles of zinc, nickel, silver, gold, palladium, platinum, and the like. The volume average particle diameter of the other metal particles may be 0.01 to 10 μm, 0.01 to 5 μm, or 0.05 to 3 μm. The shape of the other metal particles is not particularly limited. The content of the other metal particles may be less than 20% by mass, may be 10% by mass or less, may be 5% by mass or less, or may be 1% by mass or less, 0% by mass, on the basis of the total mass of the metal particles contained in the copper paste for joining, from the viewpoint of obtaining sufficient joining properties.

The content of the metal particles in the copper paste for joining of the present embodiment may be 85 to 98% by mass, may be 85 to 95% by mass, may be 85 to 90% by mass, or may be 87 to 89% by mass, on the basis of the total amount of the copper paste for joining (Dispersion Medium)

The dispersion medium is not particularly limited as long as it has a function of dispersing metal particles, and a volatile dispersion medium may be used. Examples of the volatile dispersion medium include alcohols such as monohydric alcohol and polyhydric alcohol, ethers, esters, acid amides, aliphatic hydrocarbons, and aromatic hydrocarbons. Specific examples thereof include alcohols such as cyclohexanol, ethylene glycol, diethylene glycol, propylene glycol, butylene glycol, α-terpineol, and dihydroterpineol; ethers such as diethylene glycol dimethyl ether, diethylene glycol diethyl ether, diethylene glycol dibutyl ether, diethylene glycol butyl methyl ether, diethylene glycol isopropyl methyl ether, triethylene glycol dimethyl ether, triethylene glycol butyl methyl ether, propylene glycol dimethyl ether, propylene glycol diethyl ether, propylene glycol dibutyl ether, propylene glycol dipropyl ether, and tripropylene glycol dimethyl ether; esters such as ethylene glycol ethyl ether acetate, ethylene glycol butyl ether acetate, diethylene glycol ethyl ether acetate, diethylene glycol butyl ether acetate, dipropylene glycol methyl ether acetate (DPMA), ethyl lactate, butyl lactate, γ-butyrolactone, and propylene carbonate; acid amides such as N-methyl-2-pyrrolidone, N,N-dimethylacetamide, and N,N-dimethylformamide; aliphatic hydrocarbons such as cyclohexane, octane, nonane, decane, and undecane; and aromatic hydrocarbons such as benzene, toluene, and xylene.

The copper paste for joining of the present embodiment contains dihydroterpineol as the dispersion medium from the viewpoint of achieving both of printing properties and joining properties.

The content of the dispersion medium may be 2% by mass or more, 5% by mass or more, or 10% by mass or more, or may be 50% by mass or less, 30% by mass or less, 20% by mass or less, or 15% by mass or less, on the basis of the total mass of the copper paste for joining. For example, the content of the dispersion medium may be 2 to 50% by mass, may be 5 to 30% by mass, or may be 5 to 20% by mass, on the basis of the total mass of the copper paste for joining. Furthermore, the content of the dispersion medium may be 2 to 50 parts by mass, may be 5 to 50 parts by mass, may be 2 to 15 parts by mass, may be 5 to 15 parts by mass, may be 10 to 15 parts by mass, or may be 11 to 13 parts by mass, when the total mass of the metal particles contained in the copper paste for joining is regarded as 100 parts by mass. When the content of the dispersion medium is within the above range, it is possible to adjust the copper paste for joining to a more appropriate viscosity, and the sintering of the copper particles is not easily inhibited.

The content of the dihydroterpineol in the copper paste for joining of the present embodiment may be 50 to 100% by mass, may be 50 to 90% by mass, may be 60 to 80% by mass, or may be 100% by mass, on the basis of the total mass of the dispersion medium.

The copper paste for joining preferably contains a compound having a boiling point of 300° C. or higher (hereinafter, also referred to as a high-boiling-point dispersion medium in some cases) as the dispersion medium. By containing a high-boiling-point dispersion medium, plasticity and adhesiveness are imparted to the copper paste for joining immediately before the start of sintering, and joining under non-pressurization becomes easy. The boiling point of the high-boiling-point dispersion medium may be 300 to 450° C., may be 305 to 400° C., or may be 310 to 380° C., from the viewpoint of rapidly evaporating and removing the dispersion medium when the temperature reaches the joining temperature without inhibiting sintering and densification during sintering the copper paste for joining Note that, the boiling point refers to a temperature in an atmospheric pressure (one atmosphere). Furthermore, in the present specification, a dispersion medium having a boiling point of lower than 300° C. is also referred to as a low-boiling-point dispersion medium in some cases.

Examples of the high-boiling-point dispersion medium include isobornyl cyclohexanol (MTPH, manufactured by Nippon Terpene Chemicals, Inc.), butyl stearate, EXCEPARL BS (manufactured by Kao Corporation), stearyl stearate, EXCEPARL SS (manufactured by Kao Corporation), 2-ethylhexyl stearate, EXCEPARL EH-S (manufactured by Kao Corporation), isotridecyl stearate, EXCEPARL TD-S (manufactured by Kao Corporation), heptadecane, octadecane, nonadecane, eicosane, heneicosane, docosane, methyl heptadecane, tridecyl cyclohexane, tetradecyl cyclohexane, pentadecyl cyclohexane, hexadecyl cyclohexane, undecyl benzene, dodecyl benzene, tetradecyl benzene, tridecyl benzene, pentadecyl benzene, hexadecyl benzene, heptadecyl benzene, nonyl naphthalene, diphenyl propane, octyl octanoate, methyl myristate, ethyl myristate, methyl linoleate, methyl stearate, triethylene glycol bis(2-ethyl hexanoate), tributyl citrate, dibutyl sebacate, methoxyphenethyl alcohol, benzyl phenol (C13H12O), hexadecanenitrile, heptadecanenitrile, benzyl benzoate, cinmethylin, and bis(2-ethylhexyl) adipate. From the viewpoint of more easily performing joining under non-pressurization, the high-boiling-point dispersion medium preferably contains at least one selected from the group consisting of isobornyl cyclohexanol, tributyrin, butyl stearate, and octyl octanoate.

The content of the high-boiling-point dispersion medium may be 2% by mass or more, 2.2% by mass or more, or 2.4% by mass or more, or may be 50% by mass or less, 45% by mass or less, 40% by mass or less, 20% by mass or less, 10% by mass or less, or 5% by mass or less, on the basis of the total mass of the copper paste for joining. For example, the content of the compound having a boiling point of 300° C. or higher may be 2 to 50% by mass, may be 2 to 20% by mass, or may be 2 to 5% by mass, on the basis of the total mass of the copper paste for joining.

The content of the high-boiling-point dispersion medium may be 10 to 50% by mass, may be 20 to 40% by mass, or may be 25 to 35% by mass, on the basis of the total mass of the dispersion medium.

(Other Components)

The copper paste for joining can contain, as additives, a wetting enhancer such as a nonionic surfactant or a fluorine-based surfactant; a surface-tension modifier; a dispersant such as alkylamine or alkylcarboxylic acid; a defoamer such as silicone oil; an ion trapping agent such as an inorganic ion exchanger; a saturated higher alcohol; and the like. The content of the additive can be appropriately adjusted as long as the effect of the present invention is not impaired.

The viscosity of the aforementioned copper paste for joining is not particularly limited, and from the viewpoint of compatibility with methods such as screen printing, particularly, printing conditions of an automated printer, the viscosity at 25° C. may be 100 to 250 Pa·s, may be 100 to 200 Pa·s, or may be 100 to 170 Pa·s.

The viscosity of the copper paste for joining can be measured on the basis of the viscosity measurement method of the solder paste defined in JIS (JIS Z 3284-1:2014), the viscosity refers to a value when measurement is performed by using a viscometer TV-33 (manufactured by TOKI SANGYO CO., LTD., product name) and an SPP rotor as a measurement jig under the conditions of the number of rotations of 2.5 rpm and a measurement time of 144 seconds.

According to the copper paste for joining of the present embodiment, printing properties can be improved while sufficient joining properties are maintained. Therefore, according to the copper paste for joining of the present embodiment, it is possible to efficiently produce a joined body by a mass production process using an automated printer such as a screen printer. Furthermore, the copper paste for joining of the present embodiment may be for non-pressurization joining <Preparation of Copper Paste for Joining>

The copper paste for joining can be prepared by mixing the copper particles and the dispersion medium which are described above, and other metal particles and an additive which may be contained depending on circumstances. A stirring treatment may be performed after mixing the respective components. In the copper paste for joining, the maximum particle diameter of a dispersion liquid may be adjusted by a classification operation. At this time, the maximum particle diameter of the dispersion liquid can be set to 20 μm or less, and can also be set to 10 μm or less. As metal particles of the above-described submicro copper particles and the like, those which are treated with a surface treatment agent may be used.

In the case of using submicro copper particles and micro copper particles as the copper particles, the copper paste for joining may be prepared, for example, by the following method. First, a dispersant is added as necessary to the dispersion medium, the submicro copper particles are mixed, and then the dispersion treatment is performed. Next, the micro copper particles, and as necessary, other metal particles are added and the dispersion treatment is performed. In the submicro copper particles and the micro copper particles, dispersion methods and dispersion conditions suitable for dispersion may be different. In general, the submicro copper particles are more difficult to disperse than the micro copper particles, and in order to disperse the submicro copper particles, a higher strength than a strength applied when the micro copper particles are dispersed is required. On the other hand, the micro copper particles are not only easy to disperse, but also may deform when a high strength is applied to disperse the micro copper particles. Therefore, with the procedure as described above, satisfactory dispersibility is easily obtainable and the performance of the copper paste for joining can be further improved.

The dispersion treatment can be performed using a disperser or a stirrer. Examples of the disperser and the stirrer include an Ishikawa type stirrer, a Silverson stirrer, a cavitation stirrer, a rotation and revolution-type stirring device, an ultra-thin film high-speed rotation type disperser, an ultrasonic disperser, a Raikai mixer, a twin screw kneader, a bead mill, a ball mill, a three-roll mill, a homomixer, a planetary mixer, an ultrahigh-pressure type disperser, and a thin layer shear disperser.

The classification operation can be performed, for example, by filtration, spontaneous precipitation, and centrifugal separation. Examples of a filter for filtration include a water comb, a metal mesh, a metal filter, and a nylon mesh.

The stirring operation can be performed by using a stirrer. Examples of the stirrer include an Ishikawa type stirrer, a rotation and revolution-type stirring device, a Raikai mixer, a twin screw kneader, a three-roll mill, and a planetary mixer.

<Method for Manufacturing Joined Body>

A method for manufacturing a joined body of the present embodiment is a method for manufacturing a joined body which includes a first member, a second member, and a joining portion that joins the first member and the second member, the method including: a first step of printing the copper paste for joining of the present embodiment to at least one joining surface of the first member and the second member to prepare a laminate having a laminate structure in which the first member, the copper paste for joining, and the second member are laminated in this order; and a second step of sintering the copper paste for joining of the laminate.

Examples of the first member and the second member include semiconductor elements such as IGBT, diodes, Schottky barrier diodes, MOS-FET, thyristors, logic circuits, sensors, analog integrated circuits, LED, semiconductor lasers, and transmitters; lead frames; metal plate-attached ceramic substrates (for example, DBC); base materials for mounting a semiconductor element such as LED packages; metal wirings such as copper ribbons and metal frames; block bodies such as metal blocks; members for power supply such as terminals; heat dissipation plates; and water cooling plates.

Surfaces of the first member and the second member in contact with the sintered body of the copper paste for joining may contain a metal. Examples of the metal include copper, nickel, silver, gold, palladium, platinum, lead, tin, and cobalt. The metal may be used alone or in combination of two or more kinds thereof. Furthermore, the surfaces in contact with the sintered body may be an alloy including the above-described metal. Examples of the metal used in the alloy include zinc, manganese, aluminum, beryllium, titanium, chromium, iron, and molybdenum, in addition to the above-described metal. Examples of a member in which the surfaces in contact with the sintered body contain a metal include members having various metal platings (such as chips having metal plating and lead frames having various metal platings), wires, heat spreaders, ceramic substrates to which a metal plate is attached, lead frames made of various metals, copper plates, and copper foils.

Examples of the method of printing the copper paste for joining of the present embodiment to a joining surface of a member include screen printing (stencil printing), transfer printing, offset printing, anastatic printing, intaglio printing, gravure printing, stencil printing, and jet printing. Furthermore, a method using a dispenser (for example, a jet dispenser or a needle dispenser), a comma coater, a slit coater, a die coater, a gravure coater, a slit coater, a bar coater, an applicator, a spray coater, a spin coater, a dip coater, or the like, a method by soft lithography, a particle deposition method, a method by electrodeposition coating, and the like may be used.

The thickness of the copper paste for joining may be 1 μm or more, 5 μm or more, 10 μm or more, 15 μm or more, 20 μm or more, or 50 μm or more, or may be 3000 μm or less, 1000 μm or less, 500 μm or less, 300 μm or less, 250 μm or less, or 150 μm or less. For example, the thickness of the copper paste for joining may be 1 to 1000 μm, may be 10 to 500 μm, may be 50 to 200 μm, may be 10 to 3000 μm, may be 15 to 500 μm, may be 20 to 300 μm, may be 5 to 500 μm, may be 10 to 250 μm, or may be 15 to 150 μm.

In the present embodiment, from the viewpoint of a mass production process, the copper paste for joining of the present embodiment can be printed by screen printing and can be compatible with printing speed improvement, an increase in area of an opening of a mask, and the like. The opening area of the mask may be, for example, 4 mm$^2$ or more, may be 9 mm$^2$ or more, may be 25 mm$^2$ or more, may be 49 mm$^2$ or more, or may be 100 mm$^2$ or more.

FIG. 1 is a schematic view for describing screen printing. FIGS. 1(*a*) to 1(*d*) illustrate a set of processes when a copper paste for joining 34 of the present embodiment is printed on a first member 30 disposed on a stage 35 by using a screen printer including a mask 32 and a squeegee 36. In this process, reciprocating printing is performed using two squeegees. First, the paste 34 is supplied to one end of the mask 32 (FIG. 1(*a*)). Next, one squeegee 36 is moved in one direction while being pressed against the mask 32 at a predetermined printing pressure to print (coat) the paste 34 to an opening portion of the mask 32 (FIG. 1(*b*)). Here, the paste may be supplied to the coating termination end portion as necessary. Next, the other squeegee 36 is moved in a reverse direction at the coating termination end position while being pressed at a predetermined printing pressure to print the paste 34 (FIG. 1(*c*)). Thereafter, the first member 30 is removed from the mask 32 to complete the printing (FIG. 1(*d*)). In this way, a copper paste for joining 38 having a predetermined shape is printed onto the first member 30.

The printing pressure can be set, for example, to 0.01 to 0.3 MPa. The printing speed can be adjusted, for example, in a range of 15 to 300 mm/s.

In the present embodiment, printing may be performed by attaching a scraper and a squeegee instead of two squeegees, filling a paste in an opening portion of a mask by the scraper, and transferring the filled paste onto a member by the squeegee.

The copper paste for joining that has been printed onto the member may be appropriately dried from the viewpoint of suppressing flowage during sintering and occurrence of voids. The gas atmosphere during drying may be air, may be an oxygen-free atmosphere of nitrogen, rare gas, or the like, or may be a reducing atmosphere of hydrogen, formic acid, or the like. In a drying method, drying may be performed after being left to stand at normal temperature (for example, 10 to 30° C.), heating drying may be performed, or drying under reduced pressure may be performed. In drying by heating or drying under reduced pressure, for example, a hot plate, a hot wind drier, a hot wind heating furnace, a nitrogen drier, an infrared drier, an infrared heating furnace, a far infrared heating furnace, a microwave heating apparatus, a laser heating apparatus, an electromagnetic heating apparatus, a heater heating apparatus, a vapor heating furnace, a hot-plate press apparatus, and the like can be used. The drying temperature and the drying time may be appropriately adjusted according to the type and amount of the used volatile components (for example, monohydric aliphatic alcohol and a solvent component). The drying conditions (drying temperature and drying time) may be, for example, conditions of drying at 50 to 180° C. for 1 to 120 minutes.

The laminate can be obtained by a method of disposing one member on the other member. Specific examples of the method (for example, the method of disposing the first member on the second member on which the copper paste for joining is printed) include methods using a chip mounter, a flip-chip bonder, a carbon or ceramic positioning jig, and the like.

In the second step, the copper paste for joining can be sintered by subjecting the laminate to the heating treatment. Thereby, a sintered body that becomes a joining portion is obtained. In heating treatment, for example, a hot plate, a hot wind drier, a hot wind heating furnace, a nitrogen drier, an infrared drier, an infrared heating furnace, a far infrared heating furnace, a microwave heating apparatus, a laser heating apparatus, an electromagnetic heating apparatus, a heater heating apparatus, a vapor heating furnace, and the like can be used.

From the viewpoint of suppressing the oxidation of the sintered body and members (for example, the first member and the second member), the gas atmosphere during sintering may be an oxygen-free atmosphere. From the viewpoint of removing the surface oxide of the copper particles in the copper paste for joining, the gas atmosphere during sintering may be a reducing atmosphere. Examples of the oxygen-free atmosphere include an oxygen-free gas atmosphere of nitrogen, rare gas, or the like, and vacuum. Examples of the reducing atmosphere include a pure hydrogen gas atmosphere, a mixed gas atmosphere of hydrogen and nitrogen which represent forming gas, a nitrogen atmosphere containing formic acid gas, a mixed gas atmosphere of hydrogen and rare gas, and a rare gas atmosphere containing formic acid gas.

The temperature in the heating treatment (for example, the highest temperature reached) may be 170° C. or higher, 190° C. or higher, or 200° C. or higher, or may be 250° C. or lower, lower than 250° C., 225° C. or lower, or lower than 225° C., from the viewpoint that thermal damage to members (for example, the first member and the second member) can be reduced and the viewpoint of improving a yield ratio. For example, the highest temperature reached may be 170 to 250° C., may be 170° C. or higher and lower than 250° C., may be 190 to 225° C., may be 190° C. or higher and lower than 225° C., may be 200 to 225° C., or may be 200° C. or higher and lower than 225° C.

In the second step, the copper paste for joining may be sintered by being heated under non-pressurization. That is, a laminate can be sintered in a state in which the copper paste for joining receives only the weight of a member laminated on the copper paste for joining (for example, the first member) or receives a pressure of 0.01 MPa or less, preferably 0.005 MPa or less, in addition to the weight of the laminated member and a sufficient joining strength can be obtained even in such a case. When the pressure that the copper paste for joining receives during the sintering is within the above range, a special pressurization device is not required, and thus it is possible to reduce voids and further improve the die shear strength and the connection reliability without impairing the yield ratio. Examples of a method in which the copper paste for joining receives a pressure of 0.01 MPa or less include a method in which a weight is placed on the member (for example, the first member) disposed on the upper side in the vertical direction.

Further, the method for manufacturing a joined body of the present embodiment will be described with reference to the drawings.

Figure 2:
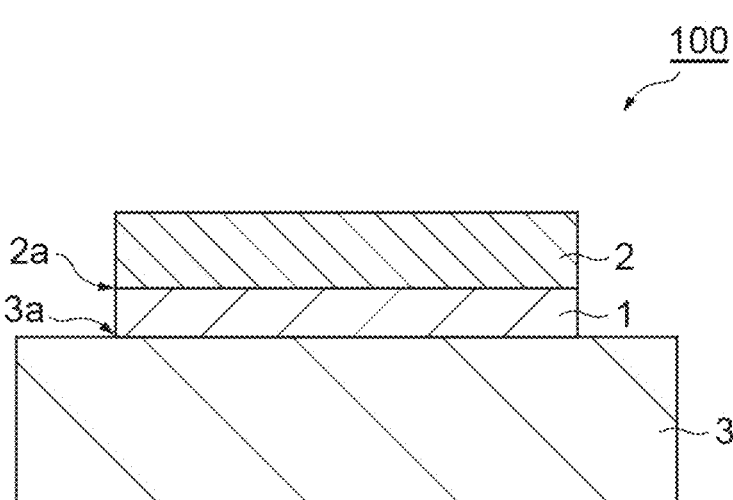
FIG. 2 is a schematic cross-sectional view illustrating a joined body manufactured by using a copper paste for joining of the present embodiment.

FIG. 2 is a schematic cross-sectional view illustrating a joined body manufactured by using the copper paste for joining of the present embodiment.

A joined body 100 illustrated in FIG. 2 includes a first member 2, a second member 3, and a joining portion 1 that joins the first member 2 and the second member 3, and the joining portion 1 is made of a sintered body of the above-described copper paste for joining.

As the first member 2 and the second member 3, those described above can be exemplified. By using the copper paste for joining of the present embodiment, it is possible to efficiently produce a joined body having a sufficient joining strength even by a mass production process using an automated printer such as a screen printer.

The die shear strength of the joined body 100 may be 15 MPa or more, may be 20 MPa or more, may be 25 MPa or more, or may be 30 MPa or more, from the viewpoint of sufficiently joining the first member 2 and the second member 3. The die shear strength can be measured by using a universal bond tester (Royce 650, manufactured by Royce Instruments), a universal bond tester (4000 series, manufactured by Nordson Dage), or the like.

The thermal conductivity of the sintered body 1 of the copper paste for joining may be 100 W/(m·K) or more, may be 120 W/(m·K) or more, or may be 150 W/(m·K) or more, from the viewpoint of heat dissipation and connection reliability at a high temperature. The thermal conductivity can be calculated from thermal diffusivity, specific heat capacity, and a density of the sintered body of the copper paste for joining.

In the above-described joined body 100, in a case where the first member 2 is a semiconductor element, the above-described joined body 100 is a semiconductor device. A semiconductor device to be obtained can have a sufficient die shear strength and connection reliability.

Figure 3:
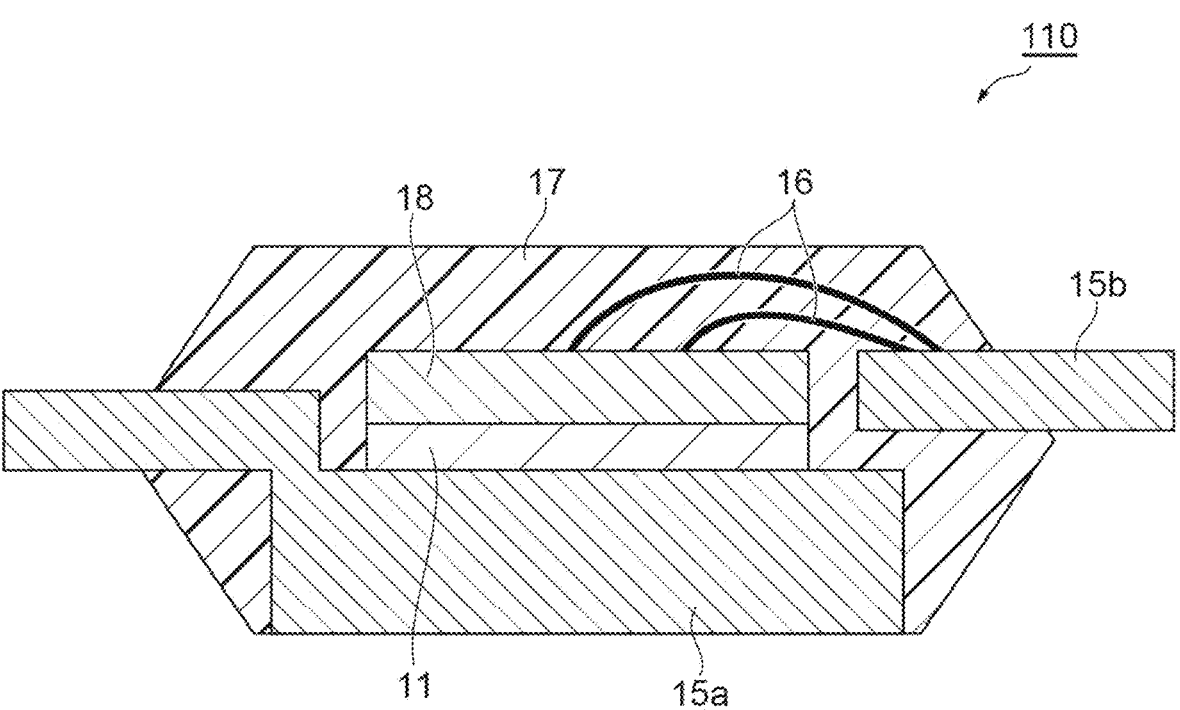
FIG. 3 is a schematic cross-sectional view illustrating an example of a semiconductor device manufactured by using the copper paste for joining of the present embodiment.

FIG. 3 is a schematic cross-sectional view illustrating an example of a semiconductor device manufactured by using the copper paste for joining of the present embodiment. A semiconductor device 110 illustrated in FIG. 3 includes a sintered body 11 of the copper paste for joining according to the present embodiment, a lead frame 15*a*, a lead frame 15*b*, a wire 16, a semiconductor element 18 connected on the lead frame 15*a* through the sintered body 11, and a mold resin 17 molding these components. The semiconductor element 18 is connected to the lead frame 15*b* through a wire 16.

Examples of the semiconductor device according to the present embodiment include power modules such as a diode, a rectifier, a thyristor, a MOS gate driver, a power switch, a power MOSFET, IGBT, a Schottky diode, and a fast recovery diode; a transmitter; an amplifier; a high-brightness LED module; and a sensor.

Figure 4:
FIG. 4 is a schematic cross-sectional view for describing a method for manufacturing the joined body illustrated in FIG. 2.
Figure 4:
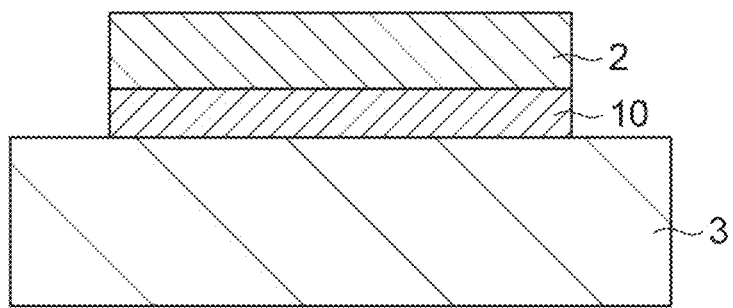
Figure 4:
Figure 4:
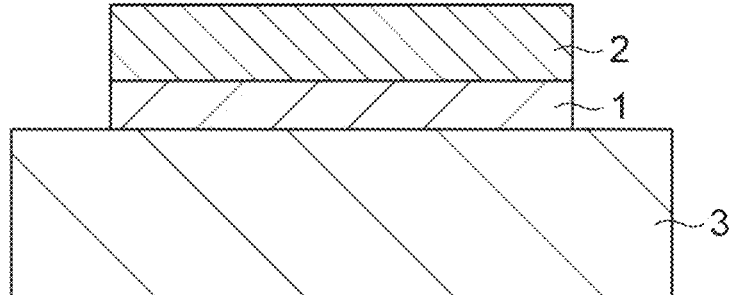

FIG. 4 (FIG. 4(*a*) and FIG. 4(*b*)) is a schematic cross-sectional view for describing a method for manufacturing the joined body 100. The method for manufacturing the joined body 100 according to the present embodiment includes a first step of preparing a laminate 50 in which the first member 2, and the above-described copper paste for joining 10 and the first member 3, which are disposed in a direction to which the weight of the first member 2 applies, are laminated in this order (FIG. 4(*a*)), and a second step of sintering the copper paste for joining 10 at a predetermined temperature in a state in which the copper paste for joining 10 receives the weight of the first member 2 or receives the weight of the first member 2 and a pressure of 0.01 MPa or less. Thereby, the joined body 100 is obtained (FIG. 4(*b*)). The direction in which the weight of the first member 2 applies can also be a direction in which the gravitational force applies.

The first step and the second step according to the present embodiment can be performed in the same manner as in the first step and the second step described above.

The semiconductor device 110 according to the present embodiment can be manufactured in the same manner as in the method for manufacturing the joined body 100 described above. That is, the method for manufacturing a semiconductor device includes a step of preparing a laminate in which the first member, and the above-described copper paste for joining and the second member, which are disposed in a direction in which the weight of the first member applies, are laminated in this order, using a semiconductor element for at least one of the first member and the second member, and sintering the copper paste for joining at a predetermined temperature in a state in which the copper paste for joining receives the weight of the first member or receives the weight of the first member and a pressure of 0.01 MPa or less.

Figure 5:
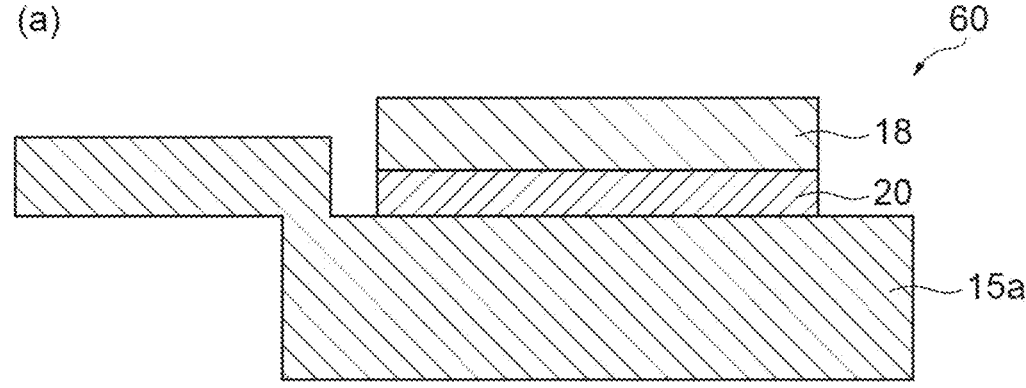
FIG. 5 is a schematic cross-sectional view for describing a method for manufacturing the semiconductor device illustrated in FIG. 3.
Figure 5:
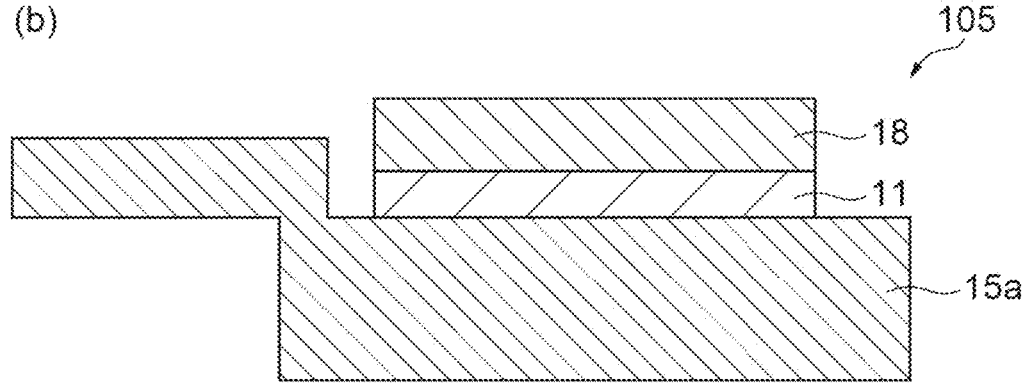
Figure 5:
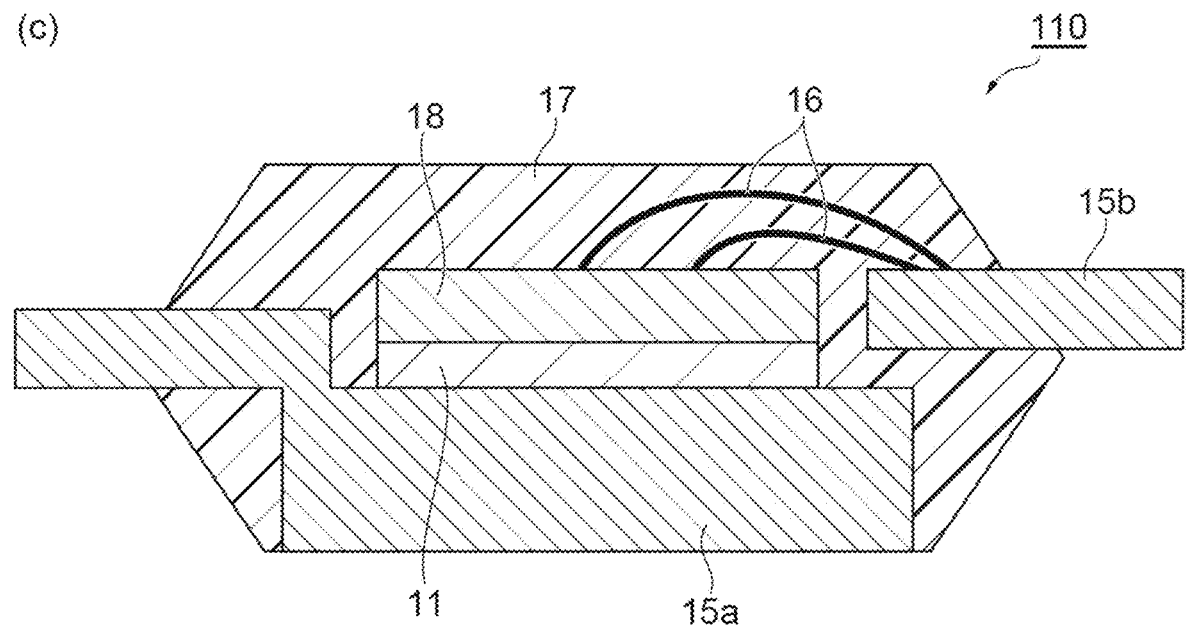

For example, illustrated in FIG. 5 (FIG. 5(*a*) to FIG. 5(*c*)), a joined body 105 is obtained by printing a copper paste for joining 20 on the lead frame 15*a* and disposing the semiconductor element 18 to obtain a laminate 60 (FIG. 5(*a*)), then heating this laminate 60, and sintering the copper paste for joining 20 (FIG. 5(*b*)). Next, the lead frame 15*b* and the semiconductor element 18 in the obtained joined body 105 are connected by the wire 16 and these are sealed by a sealing resin. The semiconductor device 110 is obtained by the above step (FIG. 5(*c*)). A semiconductor device 110 to be obtained can have a sufficient die shear strength and connection reliability even in the case of performing joining under non-pressurization. Since the semiconductor device of the present embodiment includes a sintered body of the copper paste for joining having sufficient joining force and containing copper with a high thermal conductivity and a high melting point, the semiconductor device has a sufficient die shear strength, is excellent in connection reliability, and can also become excellent in power cycle resistance. Furthermore, by using the copper paste for joining of the present embodiment that is excellent in printing properties and joining properties, the above-described semiconductor device can be efficiently manufactured.

Hereinbefore, examples of the joined body and the semiconductor device manufactured by using the copper paste for joining of the present embodiment have been described, but the joined body and the semiconductor device manufactured by using the copper paste for joining of the present embodiment are not limited to the above-described embodiments. The joined body manufactured by using the copper paste for joining of the present embodiment may be, for example, joined bodies illustrated in FIG. 6 and FIG. 8.

Figure 6:
FIG. 6 is a schematic cross-sectional view illustrating an example of a joined body manufactured by using the copper paste for joining of the present embodiment.
Figure 6:
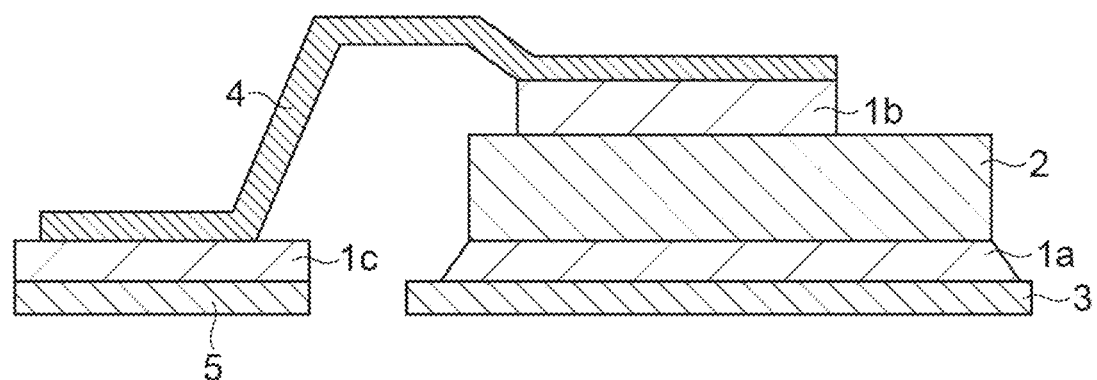

A joined body 120 illustrated in FIG. 6 includes the first member 2, the second member 3, a third member 4, a fourth member 5, a sintered body (joining portion) 1*a* of the above-described copper paste for joining that joins the first member 2 and the second member 3, a sintered body (joining portion) 1*b* of the above-described copper paste for joining that joins the first member 2 and the third member 4, a sintered body (joining portion) 1*c* of the above-described copper paste for joining that joins the third member 4 and the fourth member 5.

Figure 7:
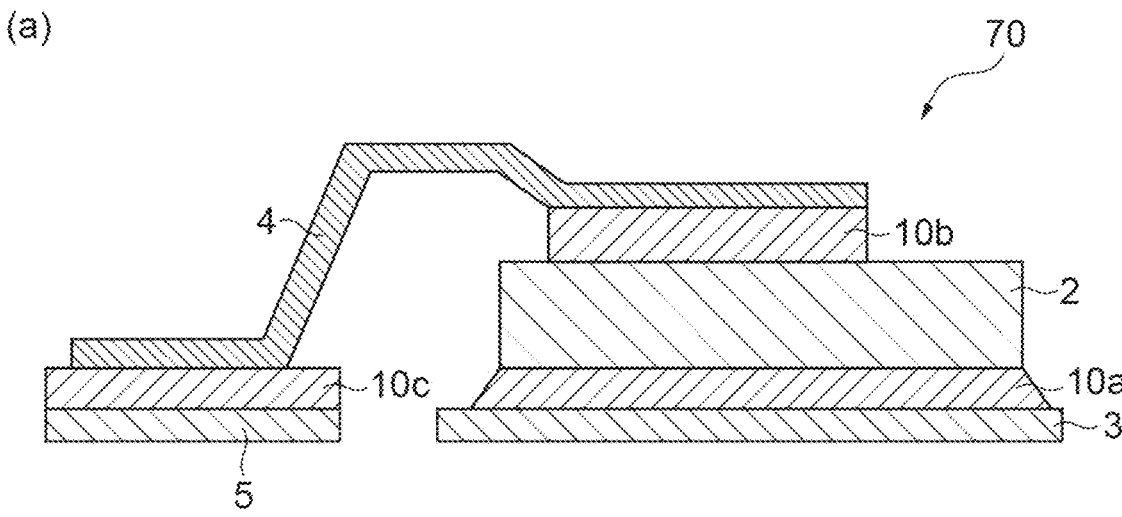
FIG. 7 is a schematic cross-sectional view for describing a method for manufacturing the joined body illustrated in FIG. 6.
Figure 7:
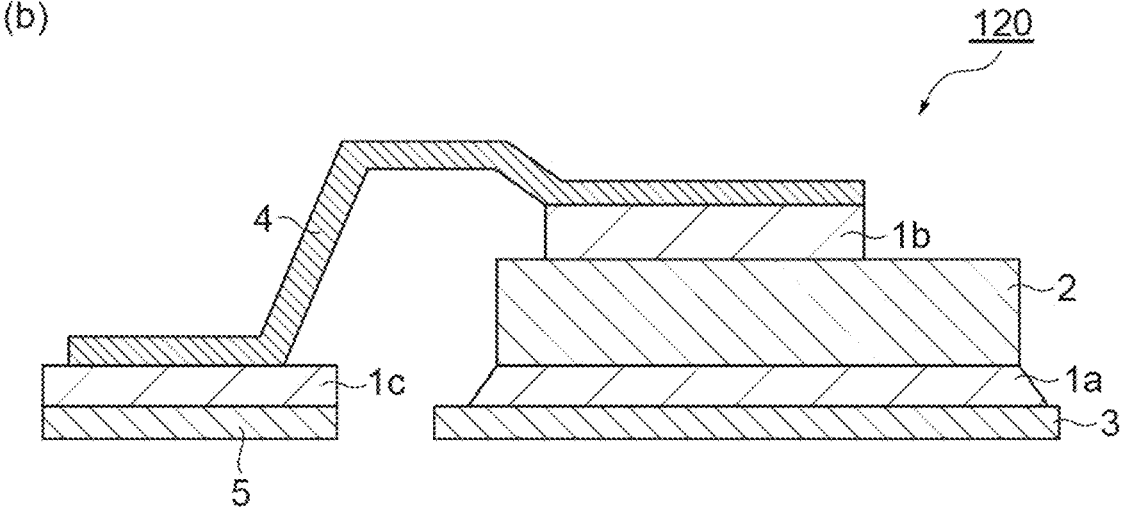

Such a joined body 120 can be obtained, for example, as illustrated in FIG. 7 (FIG. 7(*a*) and FIG. 7(*b*)), by a method including a step of preparing a laminate 70 which has a laminate portion in which the third member 4, and a second copper paste for joining 10*b*, the first member 2, a first copper paste for joining 10*a*, and the second member 3, which are disposed in a direction to which the weight of the third member 4 applies, are laminated in this order, and a laminate portion in which the third member 4, and a third copper paste for joining 10*c* and the fourth member 5, which are disposed in the direction to which the weight of the third member 4 applies, are laminated in this order (FIG. 7(*a*)), and sintering the first copper paste for joining 10*a*, the second copper paste for joining 10*b*, and the third copper paste for joining 10*c* in the same method as the method for manufacturing the joined body 100 described above (FIG. 7(*b*)). In the above-described method, the first copper paste for joining 10*a*, the second copper paste for joining 10*b*, and the third copper paste for joining 10*c* are the copper paste for joining according to the present embodiment, the first copper paste for joining 10*a* is sintered to obtain the sintered body 1*a*, the second copper paste for joining 10*b* is sintered to obtain the sintered body 1*b*, and the third copper paste for joining 10*c* is sintered to obtain the sintered body 1*c*.

Furthermore, the joined body 120 can also be obtained, for example, by a method including a step of forming a laminate portion in which the third member 4, and the second copper paste for joining 10*b* and the first member 2, which are disposed in a direction to which the weight of the third member 4 applies, are laminated in this order and a laminate portion in which the third member 4, and the third copper paste for joining 10*c* and the fourth member 5, which are disposed in the direction to which the weight of the third member 4 applies, are laminated in this order after obtaining the above-described joined body 100, and sintering the second copper paste for joining 10b and the third copper paste for joining 10c in the same method as the method for manufacturing the joined body 100 described above.

Figure 8:
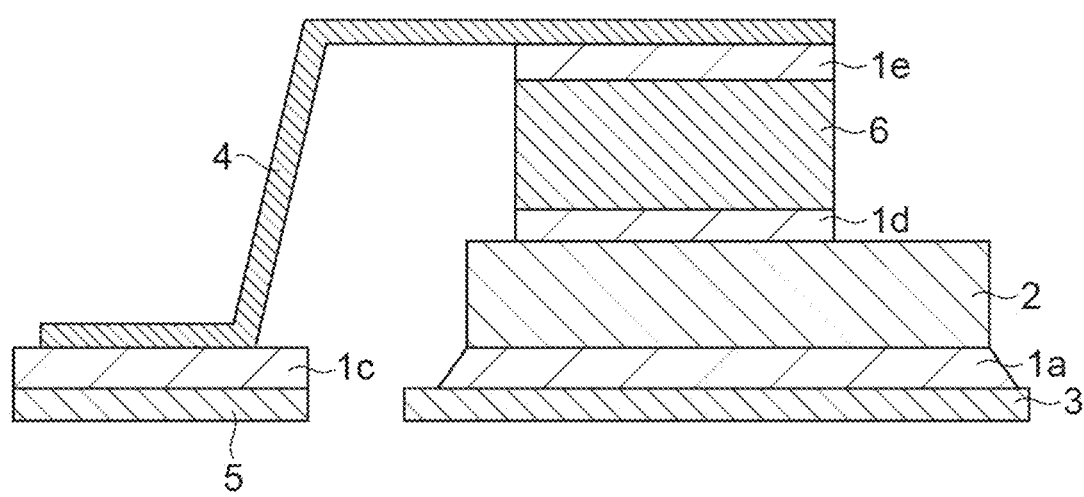
FIG. 8 is a schematic cross-sectional view illustrating an example of a joined body manufactured by using the copper paste for joining of the present embodiment.

A joined body 130 illustrated in FIG. 8 includes the first member 2, the second member 3, the third member 4, the fourth member 5, a fifth member 6, the sintered body (joining portion) 1a of the above-described copper paste for joining that joins the first member 2 and the second member 3, the sintered body (joining portion) 1c of the above-described copper paste for joining that joins the third member 4 and the fourth member 5, a sintered body (joining portion) 1d of the above-described copper paste for joining that joins the first member 2 and the fifth member 6, and a sintered body (joining portion) le of the above-described copper paste for joining that joins the third member 4 and the fifth member 6.

Figure 9:
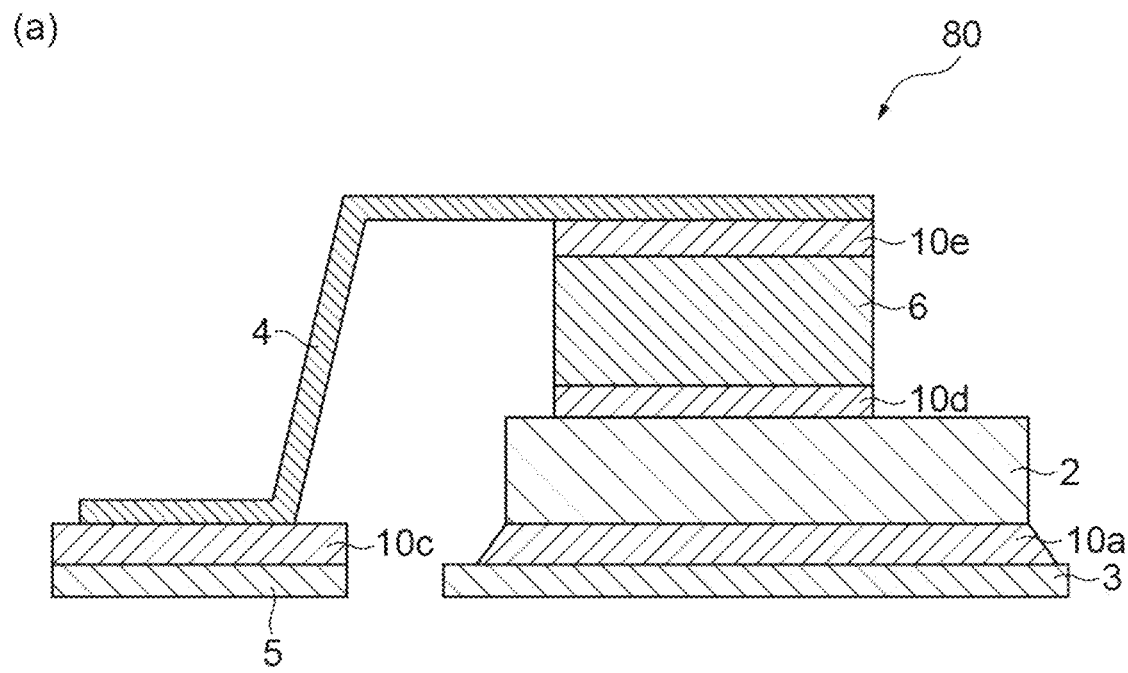
FIG. 9 is a schematic cross-sectional view for describing a method for manufacturing the joined body illustrated in FIG. 8.
Figure 9:
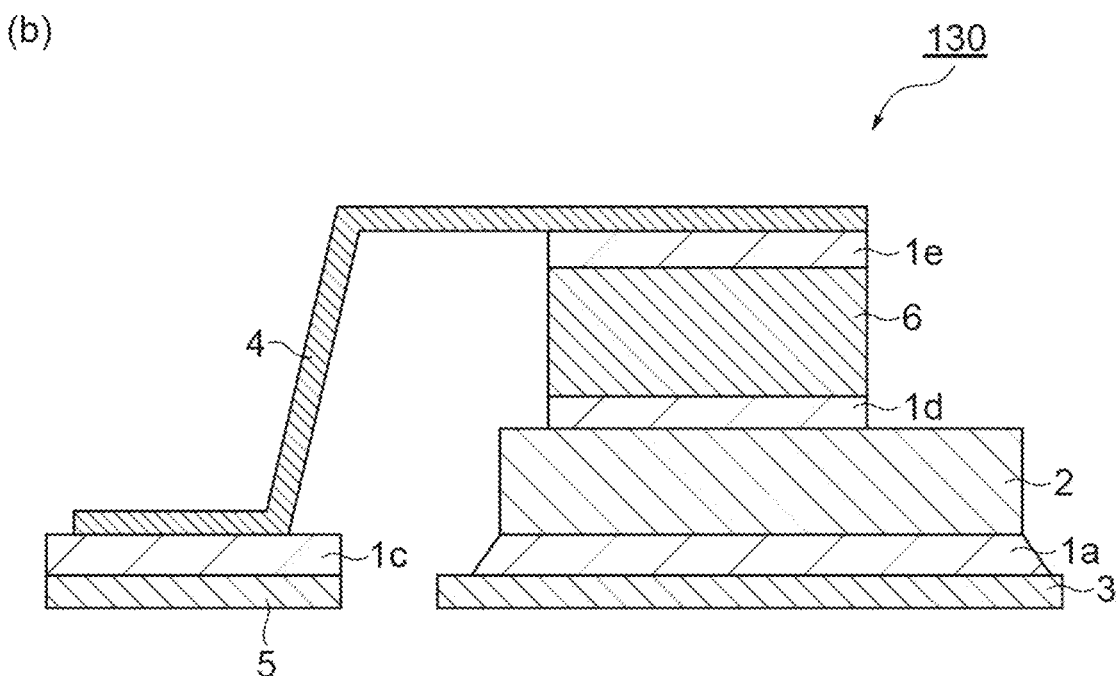

Such a joined body 130 can be obtained, for example, as illustrated in FIG. 9 (FIG. 9(a) and FIG. 9(b)), by a method including a step of preparing a laminate 80 which has a laminate portion in which the third member 4, and a fifth copper paste for joining 10e, the fifth member 6, a fourth copper paste for joining 10d, the first member 2, the first copper paste for joining 10a, and the second member 3, which are disposed in a direction to which the weight of the third member 4 applies, are laminated in this order, and a laminate portion in which the third member 4, and the third copper paste for joining 10c and the fourth member 5, which are disposed in the direction to which the weight of the third member 4 applies, are laminated in this order (FIG. 9(a)), and sintering the first copper paste for joining 10a, the third copper paste for joining 10c, the fourth copper paste for joining 10d, and the fifth copper paste for joining 10e in the same method as the method for manufacturing the joined body 100 described above (FIG. 9(b)). In the above-described method, the first copper paste for joining 10a, the third copper paste for joining 10c, the fourth copper paste for joining 10d, and the fifth copper paste for joining 10e are the copper paste for joining according to the present embodiment, the first copper paste for joining 10a is sintered to obtain the sintered body 1a, the third copper paste for joining 10c is sintered to obtain the sintered body 1c, the fourth copper paste for joining 10d is sintered to obtain the sintered body 1d, and the fifth copper paste for joining 10e is sintered to obtain the sintered body 1e.

Furthermore, the joined body 130 can also be obtained by a method including a step of preparing a laminate in which the third member 4, and the fifth copper paste for joining 10e, the fifth member 6, the fourth copper paste for joining 10d, the first member 2, the first copper paste for joining 10a, and the second member 3, which are disposed in a direction to which the weight of the third member 4 applies, are laminated in this order, sintering the first copper paste for joining 10a, the fourth copper paste for joining 10d, and the fifth copper paste for joining 10e in the same method as the method for manufacturing the joined body 100 described above, then forming a laminate portion in which the third member 4, and the third copper paste for joining 10c and the fourth member 5, which are disposed in the direction to which the weight of the third member 4 applies, are laminated in this order, and sintering the third copper paste for joining 10c in the same method as the method for manufacturing the joined body 100 described above.

Furthermore, the joined body 130 can also be obtained by a method including a step of forming a laminate portion in which the third member 4, and the fifth copper paste for joining 10e, the fifth member 6, the fourth copper paste for joining 10d, and the first member 2, which are disposed in a direction to which the weight of the third member 4 applies, are laminated in this order, and a laminate portion in which the third member 4, and the third copper paste for joining 10c and the fourth member 5, which are disposed in the direction to which the weight of the third member 4 applies, are laminated in this order after obtaining the above-described joined body 100, and sintering the third copper paste for joining 10c, the fourth copper paste for joining 10d, and the fifth copper paste for joining 10e in the same method as the method for manufacturing the joined body 100 described above.

In the above-described modified examples, examples of the third member 4, the fourth member 5, and the fifth member 6 are the same as examples of the second member 3. Furthermore, surfaces of the third member 4, the fourth member 5, and the fifth member 6 in contact with the sintered body of the copper paste for joining may contain a metal. Examples of metals which may be contained are the same as examples of metals which may be contained in the surfaces of the first member and the second member in contact with the sintered body of the copper paste for joining. Furthermore, the first copper paste for joining 10a, the second copper paste for joining 10b, the third copper paste for joining 10c, the fourth copper paste for joining 10d, and the fifth copper paste for joining 10e which are used in the above-described modified examples may be the same as or different from each other.

EXAMPLES

Hereinafter, the present invention will be described more specifically by way of Examples and Comparative Example; however, the present invention is not intended to be limited to the following Examples.

<Preparation of Copper Paste for Joining>

Example 1

60.7 parts by mass of CH-0200 (manufactured by MITSUI MINING & SMELTING CO., LTD., product name, 50% volume average particle diameter: 0.3 μm) as material containing submicro copper particles, 8.0 parts by mass of dihydroterpineol (manufactured by Nippon Terpene Chemicals, Inc.), 3.6 parts by mass of tributyrin (boiling point: 305° C., manufactured by FUJIFILM Wako Pure Chemical Corporation), and 0.4 parts by mass of Fine Oxocol-180T (manufactured by FUJIFILM Wako Pure Chemical Corporation) were mixed by a stirrer manufactured by THINKY CORPORATION (trade name: "Awatori Rentaro ARE-310", hereinafter, the same applies) under the condition of 2000 rpm and for 1 minute. Thereafter, the dispersion treatment was performed 10 times with a three-roll mill to obtain a mixture.

The mixture obtained by the dispersion treatment was transferred to a polyethylene container, and then 27.1 parts by mass of 3L3N (manufactured by MITSUI MINING & SMELTING CO., LTD., product name, 50% volume average particle diameter: 7 μm) was weighed as a material containing flake-shaped micro copper particles and added to the container, and mixed by a stirrer manufactured by THINKY CORPORATION under the condition of 2000 rpm and for 1 minute. Thereafter, the dispersion treatment was performed 5 times with a three-roll mill to obtain a copper paste for joining.

Example 2 and Reference Example 1

In Example 2, the amount of the solvent of the paste in Example 1 was reduced, and the metal particle concentration was adjusted to 89% by mass. In Reference Example 1, a copper pastes for joining was prepared in the same manner as in Example 1, except that the composition of the copper paste for joining was changed to the composition shown in Table 1 (the unit of the numerical value is parts by mass).

<Evaluation of Copper Paste for Joining>

The viscosity, printing properties, and joining properties of the copper pastes for joining obtained above were evaluated according to the following method. Results of the viscosity are shown in Table 1.

(Viscosity)

The viscosity of the copper paste for joining was measured according to the viscosity measurement method of the solder paste defined in JIS (JIS Z 3284-1:2014) by using a viscometer TV-33 (manufactured by TOM SANGYO CO., LTD., product name) and an SPP rotor as a measurement jig under the conditions of the number of rotations of 2.5 rpm and a measurement time of 144 seconds.

(Printing Properties)

Printing using a screen printer was performed on a copper plater under the following conditions, and printing properties were evaluated. Note that, the opening size was set to 3 mm square, 5 mm square, 7 mm square, and 10 mm square.

A stainless-steel metal mask (thickness: 200 μm) having openings with respective printing shapes (3 mm square, 5 mm square, 7 mm square, and 10 mm square) was placed on a copper plate, and the copper paste for joining was printed thereto by stencil printing in which a metal squeegee was used, under conditions of outbound motion: speed of 150 mm/s, printing pressure of 0.2 MPa, inbound motion: 100 mm/s, printing pressure of 0.1 MPa.

In Examples 1 and 2, printing could be satisfactorily performed with all of the opening sizes. In Reference Example 1, missing of the opening edge portion in the printing area and roughness on the printed surface were recognized.

(Joining Properties)

The joining properties of the copper paste for joining were evaluated by a joining area ratio (%) of a joined body produced by the following method.

<Production of Joined Body>

A stainless-steel metal mask (thickness: 200 μm) having openings with respective printing shapes (3 mm square, 5 mm square, 7 mm square, and 10 mm square) was placed on a copper plate, and the copper paste for joining was printed thereto by stencil printing in which a metal squeegee was used, under conditions of outbound motion: speed of 150 mm/s, printing pressure of 0.2 MPa, inbound motion: 100 mm/s, printing pressure of 0.1 MPa. A Si chip on which a Ni layer had been formed was placed on the printed copper paste and then dried at 60° C. for 5 minutes or 10 minutes by using a hot plate (manufactured by AS ONE Corporation, product name, "EC-1200N"). Next, the sample on which the chip had been placed was set in a tube furnace (manufactured by R-DEC Co., Ltd.), and argon gas was caused to flow thereinto at 3 L/min for 5 minutes, thereby substituting the air into the argon gas. Thereafter, the hydrogen gas was allowed to flow at 500 mL/min, and the temperature was increased for 30 minutes to the joining temperature. After the increase of the temperature, the temperature was maintained at 225° C. for 60 minutes under the flow of hydrogen gas, and then the temperature was cooled to 200° C. over 15 minutes. Finally, the sample was removed into the air when the sample temperature reached 60° C. or lower by forced cooling with an air blower from the outside of the tube furnace under the flow of argon gas at 0.3 L/min.

<Joining Area Ratio>

The sample of the joined body was analyzed by ultrasonic test equipment (manufactured by Insight k.k, Insight-300) to obtain an ultrasonic test image (SAT image) of the joining portion. The obtained SAT image was binarized to calculate the joining area ratio (area %) with respect to the chip area.

In Examples 1 and 2, the joining area ratio in all of the opening sizes was 99% or more.

TABLE 1

|  |  |  | Example 1 | Example 2 | Reference Example 1 |
|---|---|---|---|---|---|
| Paste composition | Copper particles | Submicro copper particles A | 60.7 | * | 57.2 |
|  |  | Micro copper particles A | 27.1 | * | 30.6 |
|  | Other metal particles | Zinc particles A | 0.2 | * | 0.2 |
|  | Low-boiling-point dispersion medium | Dihydroterpineol | 8.0 | * | — |
|  |  | Terpineol C | — | * | 8.4 |
|  | High-boiling-point dispersion medium | Tributyrin | 3.6 | * | 3.6 |
|  | Additive | Additive A | 0.4 | * | — |
| Viscosity (Pa · s) at 25° C. |  |  | 125 | 171 | 266 |

* The amount of the solvent of the paste in Example 1 was reduced, and the metal particle concentration was adjusted to 89% by mass The details of respective components are as described below.

(Copper Particles)

Submicro copper particles A: CH-0200 (manufactured by MITSUI MINING & SMELTING CO., LTD., product name, 50% volume average particle diameter: 0.3 μm)

Micro copper particles A: 3L3N (manufactured by Fukuda Metal Foil & Powder Co., Ltd., product name, 50% volume average particle diameter: 7 μm)

(Other Metal Particles)

Zinc particles A: Zinc powder (manufactured by Alfa Aesar, product name, 50% volume average particle diameter: 4 μm)

(Dispersion Medium)

Dihydroterpineol: manufactured by Nippon Terpene Chemicals, Inc., product name, boiling point 208° C.

Terpineol C: manufactured by Nippon Terpene Chemicals, Inc., product name, boiling point 220° C.

Tributyrin: manufactured by FUJIFILM Wako Pure Chemical Corporation, product name, boiling point 305° C.

(Additive)
Additive A: Fine Oxocol-180T (manufactured by FUJIF-ILM Wako Pure Chemical Corporation, isooctadecanol)

As shown in Table 1, it was confirmed that the copper pastes for joining of Examples 1 and 2 can be satisfactorily printed with an opening size of 3 to 10 mm square in the printing conditions of assuming automated printing, and a sufficient joining properties can be achieved. Dihydroterpineol is obtained by hydrogenation of a double bond included in the molecular structure of terpineol to give a single bond and is considered to be similar in the molecular structure and properties to terpineol; however, dihydroterpineol can considerably reduce the viscosity of the copper paste and attains sufficient joining properties, which are unexpected effects.

REFERENCE SIGNS LIST 1, 1a, 1b, 1c, 1d, 1e, 11: sintered body of copper paste for joining (joining portion), 2: first member, 3: second member, 10, 10a, 10b, 10c, 10d, 10e, 20: copper paste for joining, 15a, 15b: lead frame, 16: wire, 17: mold resin, 18: semiconductor element, 30: first member, 32: mask, 34, 38: copper paste for joining, 35: stage, 36: squeegee, 50, 60, 70, 80: laminate, 100, 105, 120, 130: joined body, 110: semiconductor device.

The invention claimed is:

1. A copper paste for joining, comprising:
metal particles comprising copper particles; and a dispersion medium comprising dihydroterpineol, wherein
a content of the dispersion medium is 5 to less than 15% by mass on the basis of the total mass of the copper paste for joining,
a content of the dihydroterpineol is 50 to 100% by mass on the basis of the total mass of the dispersion medium,
a content of the metal particles is greater than 85% on the basis of the total amount of the copper paste for joining, and
a viscosity of the copper paste for joining at 25° C. is 100 to 250 Pa·s.

2. The copper paste for joining according to claim 1, wherein a content of the metal particles is 87 to 95% by mass on the basis of the total amount of the copper paste for joining.

3. The copper paste for joining according to claim 1, wherein the dispersion medium further contains a compound having a boiling point of 300° C. or higher.

4. The copper paste for joining according to claim 1, wherein a viscosity at 25° C. is 100 to 200 Pa·s.

5. The copper paste for joining according to claim 1, wherein a content of the copper particles is 80 to 100% by mass on the basis of the total mass of the metal particles.

6. The copper paste for joining according to claim 1, wherein the copper paste for joining is for screen printing.

7. The copper paste for joining according to claim 1, wherein the copper paste for joining contains submicro copper particles having a volume average particle diameter of 0.12 to 0.8 µm and flake-shaped micro copper particles having a maximum diameter of 2 to 50 µm and an aspect ratio of 3.0 or more as the copper particles.

8. The copper paste for joining according to claim 7, wherein a content of the submicro copper particles is 30 to 90% by mass on the basis of the total mass of the copper particles, and
a content of the micro copper particles is 10 to 70% by mass on the basis of the total mass of the copper particles.

9. The copper paste for joining according to claim 1, wherein the copper paste for joining is for non-pressurization joining.

10. A method for manufacturing a joined body which includes a first member, a second member, and a joining portion that joins the first member and the second member, the method comprising:
a first step of printing the copper paste for joining according to claim 1 to at least one joining surface of the first member and the second member to prepare a laminate having a laminate structure in which the first member, the copper paste for joining, and the second member are laminated in this order; and
a second step of sintering the copper paste for joining of the laminate.

11. The method for manufacturing a joined body according to claim 10, wherein the printing is screen printing.

12. The method for manufacturing a joined body according to claim 10, wherein in the second step, the copper paste for joining is sintered by being heated under non-pressurization.

13. The method for manufacturing a joined body according to claim 10, wherein at least one of the first member and the second member is a semiconductor element.

14. A joined body comprising: a first member; a second member; and a joining portion that joins the first member and the second member, wherein the joining portion is made of a sintered body of the copper paste for joining according to claim 1.

15. The joined body according to claim 14, wherein at least one of the first member and the second member is a semiconductor element.

16. The copper paste for joining according to claim 1, wherein the content of the dispersion medium is 11 to 13 parts by mass when a total mass of the metal particles contained in the copper paste for joining is regarded as 100 parts by mass.

17. The copper paste for joining according to claim 1, wherein the content of the dispersion medium is 10 to 15 parts by mass when a total mass of the metal particles contained in the copper paste for joining is regarded as 100 parts by mass.

18. The copper paste for joining according to claim 1, wherein the content of the dihydroterpineol is 50 to 90% by mass on the basis of the total mass of the dispersion medium.

19. The copper paste for joining according to claim 1, wherein the content of the dihydroterpineol is 60 to 80% by mass on the basis of the total mass of the dispersion medium.

* * * * *